(12) United States Patent
Hong et al.

(10) Patent No.: US 9,647,243 B2
(45) Date of Patent: May 9, 2017

(54) DISPLAY APPARATUS AND METHOD OF MANUFACTURING THE SAME

(71) Applicant: SAMSUNG DISPLAY CO., LTD., Yongin, Gyeonggi-Do (KR)

(72) Inventors: Soon-Wook Hong, Uijeongbu-Si (KR); Seung-Sok Son, Asan-Si (KR); Yeon-Kyu Moon, Asan-Si (KR); Jae-Hyun Park, Yongin-Si (KR); Kap-Soo Yoon, Gangseo-Gu (KR); Jin-Won Lee, Cheonan-Si (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/213,599

(22) Filed: Mar. 14, 2014

(65) Prior Publication Data
US 2014/0284574 A1    Sep. 25, 2014

(30) Foreign Application Priority Data
Mar. 20, 2013    (KR) .................. 10-2013-0029585

(51) Int. Cl.
*H01L 27/32*    (2006.01)
*H01L 51/56*    (2006.01)
(Continued)

(52) U.S. Cl.
CPC ............ *H01L 51/56* (2013.01); *G02F 1/1345* (2013.01); *G02F 1/13452* (2013.01);
(Continued)

(58) Field of Classification Search
CPC ............... H01L 27/1214; H01L 27/124; H01L 27/3276; G02F 1/1345; G02F 1/13452; G02F 1/13458; G02F 1/136286
See application file for complete search history.

(56) References Cited

U.S. PATENT DOCUMENTS 7,448,785 B2    11/2008    Suzuki
7,561,223 B2    7/2009    Chu et al.
(Continued)

FOREIGN PATENT DOCUMENTS

JP    3670580    4/2005
KR    10-0603836    7/2006

OTHER PUBLICATIONS

English Abstract Publication No. JP 2002-189226 (for JP 3670580).

*Primary Examiner* — Yu Chen
(74) *Attorney, Agent, or Firm* — F. Chau & Associates, LLC (57) ABSTRACT

A display apparatus includes a pixel part disposed in a display area of a base substrate, including a switching element connected to a signal line, a pixel electrode connected to the switching element and a common electrode that overlaps the pixel electrode, a plurality of fan-out lines disposed in a peripheral area of the base substrate that are connected to the signal line of the display area, a plurality of pads disposed in the peripheral area of the base substrate that are respectively connected to end portions of the fan-out lines, an organic layer that covers the switching element of the display area and that extends from the display area to a portion of the fan-out lines, and an electrode pattern that overlaps the fan-out lines in a boundary portion of the organic layer.

8 Claims, 9 Drawing Sheets

(51) Int. Cl.
*G02F 1/1362* (2006.01)
*G02F 1/1345* (2006.01)
*G02F 1/1343* (2006.01)

(52) U.S. Cl.
CPC .... *G02F 1/136286* (2013.01); *H01L 27/3276* (2013.01); *G02F 2001/134372* (2013.01)

(56) References Cited

U.S. PATENT DOCUMENTS

| | | |
|---|---|---|
| 7,593,085 B2 | 9/2009 | Watanabe et al. |
| 7,659,957 B2 | 2/2010 | Park et al. |
| 2007/0268442 A1 | 11/2007 | Oh et al. |
| 2008/0043196 A1* | 2/2008 | Fujita .................... G02F 1/1345 349/152 |
| 2011/0096258 A1* | 4/2011 | Shim et al. ...................... 349/39 |
| 2012/0120616 A1* | 5/2012 | Katsui et al. ................. 361/748 |

* cited by examiner

DISPLAY APPARATUS AND METHOD OF MANUFACTURING THE SAME

CROSS REFERENCE TO RELATED APPLICATIONS

This application claims priority from Korean Patent Application No. 10-2013-0029585, filed on Mar. 20, 2013 in the Korean Intellectual Property Office, and all the benefits accruing therefrom, the contents of which are herein incorporated by reference in their entirety.

BACKGROUND

1. Technical Field

Exemplary embodiments of the present disclosure are directed to a display apparatus and a method of manufacturing the display apparatus. More particularly, exemplary embodiments of the present disclosure are directed to a display apparatus capable of improved reliability and method of manufacturing thereof.

2. Discussion of the Related Art

In general, a liquid crystal display ("LCD") apparatus is relatively thin, light weight and has low power consumption, and thus an LCD apparatus is used in monitors, laptop computers and cellular phones, etc. An LCD apparatus typically includes an LCD panel and a backlight assembly disposed under the LCD panel that provides light to the LCD panel, and displays images by manipulating the light transmittance of the liquid crystals.

A liquid crystal display panel displays an image by applying voltage to the liquid crystal layer to control light transmittance through the liquid crystal layer. A display apparatus may be classified as a normally black mode or a normally white mode, according to the image displayed in an initial state when no electric field is applied to the liquid crystal display panel.

In addition, a display apparatus may be classified as a vertical electric field mode that includes a vertical alignment mode ("VA") mode, and a horizontal electric field mode that includes an in plane switching mode ("IPS") mode, according to the direction of the liquid crystal molecules when an electric field is applied to the liquid crystal layer. A VA mode or an IPS mode primarily uses a normally black mode to maximize the contrast ratio. In particular, an IPS mode may be used to improve the side viewing angle.

A signal line disposed in a peripheral area of the LCD panel is frequently damaged by water permeation in high-temperature or high-humidity reliability evaluations.

SUMMARY

Exemplary embodiments of the present disclosure provide a display apparatus that may improve the reliability of a signal line.

Exemplary embodiments of the present disclosure also provide a method of manufacturing the display apparatus.

According to an exemplary embodiment of the disclosure, there is provided a display apparatus, including a pixel part disposed in a display area of a base substrate that includes a switching element connected to a signal line, a pixel electrode connected to the switching element and a common electrode that overlaps the pixel electrode, a plurality of fan-out lines disposed in a peripheral area of the base substrate that are connected to the signal line of the display area, a plurality of pads disposed in the peripheral area of the base substrate that are respectively connected to end portions of the fan-out lines, an organic layer that covers the switching element of the display area and that extends from the display area to a portion of the fan-out lines, and an electrode pattern that overlaps the fan-out lines disposed in a boundary portion of the organic layer.

In an exemplary embodiment, the display apparatus may further include a peripheral pattern that covers a portion of the fan-out lines.

In an exemplary embodiment, the electrode pattern may extend from the peripheral pattern.

In an exemplary embodiment, the electrode pattern has an island shape that may be spaced apart from the peripheral pattern and may extend in a direction that crosses the fan-out lines.

In an exemplary embodiment, the electrode pattern may include a plurality of line electrode patterns, each of which overlaps one of the fan-out lines.

In an exemplary embodiment, the display apparatus may further include a protecting layer disposed on the organic layer, wherein the electrode pattern is disposed between the protecting layer and the organic layer.

In an exemplary embodiment, the display apparatus may further include a protecting layer disposed on the organic layer, wherein the electrode pattern is disposed on the protecting layer.

In an exemplary embodiment, the electrode pattern is electrically connected with the common electrode.

In an exemplary embodiment, the pixel electrode and the common electrode are disposed on the organic layer.

According to an exemplary embodiment of the disclosure, there is provided a display apparatus, including a pixel part disposed in a display area of a base substrate that includes a switching element connected to a signal line, a pixel electrode connected to the switching element and a common electrode that overlaps the pixel electrode, a plurality of fan-out lines disposed in a peripheral area of the base substrate that are connected to the signal line of the display area, a plurality of pads disposed in the peripheral area of the base substrate that are respectively connected to end portions of the fan-out lines, an organic layer that covers the switching element of the display area and extends from the display area to an area adjacent to the pad part, and an adhesion member disposed on the pads that overlaps a boundary portion of the organic layer, and that electrically connects the pad part with a terminal of a driving chip.

According to another exemplary embodiment of the disclosure, there is provided a method of manufacturing a display apparatus, including forming a signal line in a display area of a base substrate, a switching element in the display area that is connected to the signal line, and a fan-out part in a peripheral area of the base substrate, forming an organic layer that covers the switching element of the display area and that extends from the display area to a portion of the fan-out part, and forming a pixel electrode connected to the switching element, a common electrode that overlaps the pixel electrode and an electrode pattern that overlaps the fan-out line in a boundary portion of the organic layer.

In an exemplary embodiment, forming the electrode pattern may include forming a peripheral pattern that covers a partial area of the fan-out part, and the fan-out part may include a plurality of fan-out lines connected to the signal line.

In an exemplary embodiment, the electrode pattern may extend from the peripheral pattern.

In an exemplary embodiment, the electrode pattern may have an island shape that is spaced apart from the peripheral pattern and that extends in a direction that crosses the fan-out lines.

In an exemplary embodiment, the electrode pattern may include a plurality of line electrode patterns, each of which overlaps one of the plurality of fan-out lines.

In an exemplary embodiment, forming the electrode pattern may include forming the common electrode on the organic layer from a first transparent conductive layer, and forming the pixel electrode common electrode from a second transparent conductive layer.

In an exemplary embodiment, the electrode pattern may be patterned from the first transparent conductive layer.

In an exemplary embodiment, the electrode pattern may be electrically connected to the common electrode.

In an exemplary embodiment, the electrode pattern may be patterned from the second transparent conductive layer.

According to another exemplary embodiment of the disclosure, there is provided a method of manufacturing a display apparatus, including forming a signal line in a display area of a base substrate, a switching element in the display area that is connected to the signal line, and a fan-out part a peripheral area of the base substrate that is connected to the signal line, forming an organic layer that covers the switching element in the display area and that extends from the display area to an area adjacent to an end portion of the fan-out part, forming a pixel electrode connected to the switching element, a common electrode that overlaps the pixel electrode, and a pad part connected to the end portion of the fan-out part, and forming an adhesion member disposed on the pad that electrically connects the pad with a terminal of a driving chip, wherein the adhesion member overlaps a boundary portion of the organic layer.

According to embodiments of the present disclosure, the electrode pattern covers the boundary portion of the organic layer so that the fan-out lines in the boundary portion of the organic layer may be protected from water permeation damage. In addition, the organic layer extends to an area adjacent to the pad part, and the adhesion member disposed on the pad part overlaps the boundary portion of the organic layer so that the fan-out lines disposed in the peripheral area may be protected from water damage.

DETAILED DESCRIPTION OF EXEMPLARY EMBODIMENTS

Hereinafter, exemplary embodiments of the present disclosure will be explained in detail with reference to the accompanying drawings.

Figure 1:
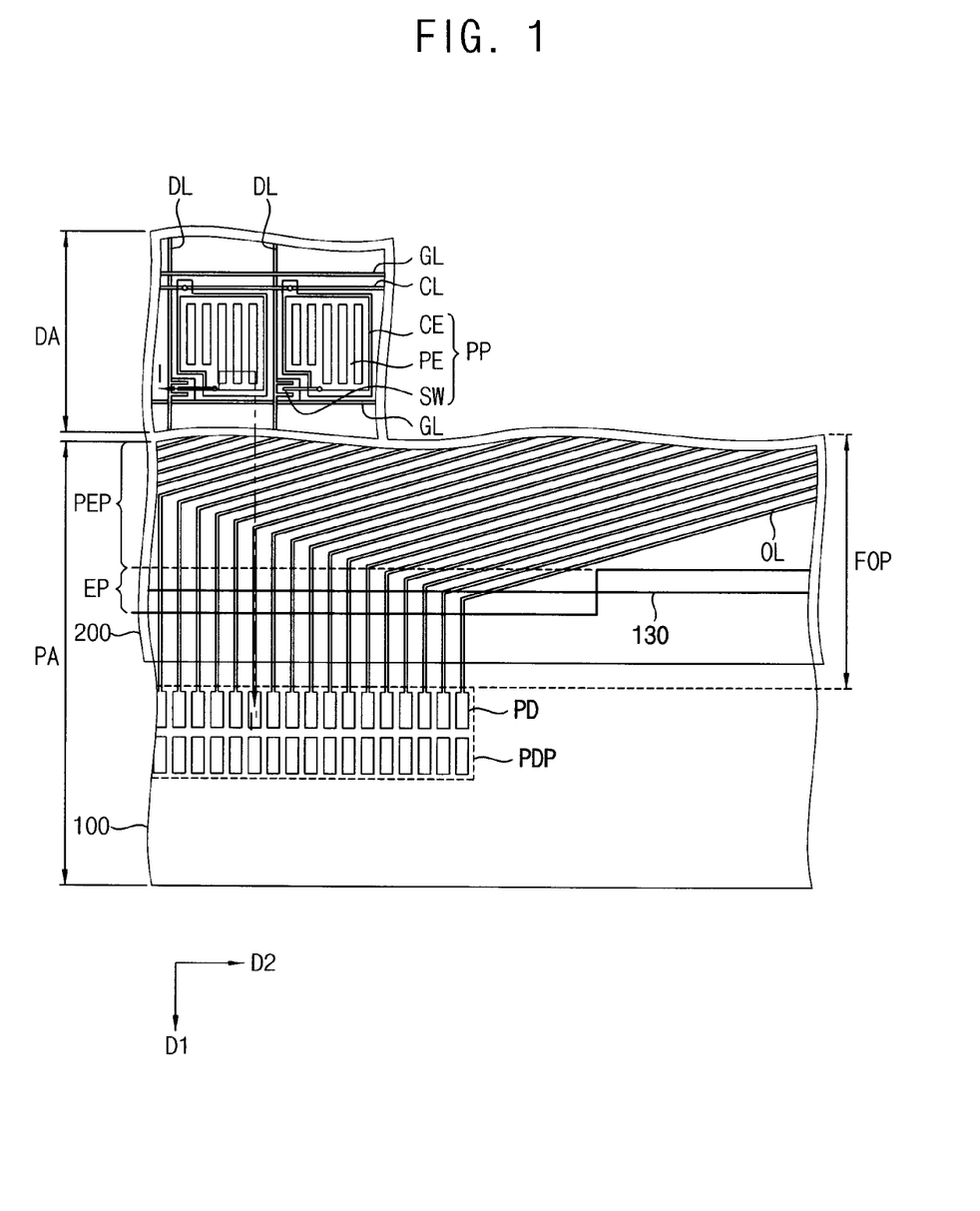
FIG. 1 is a plan view illustrating a display apparatus according to an exemplary embodiment.
Figure 2:
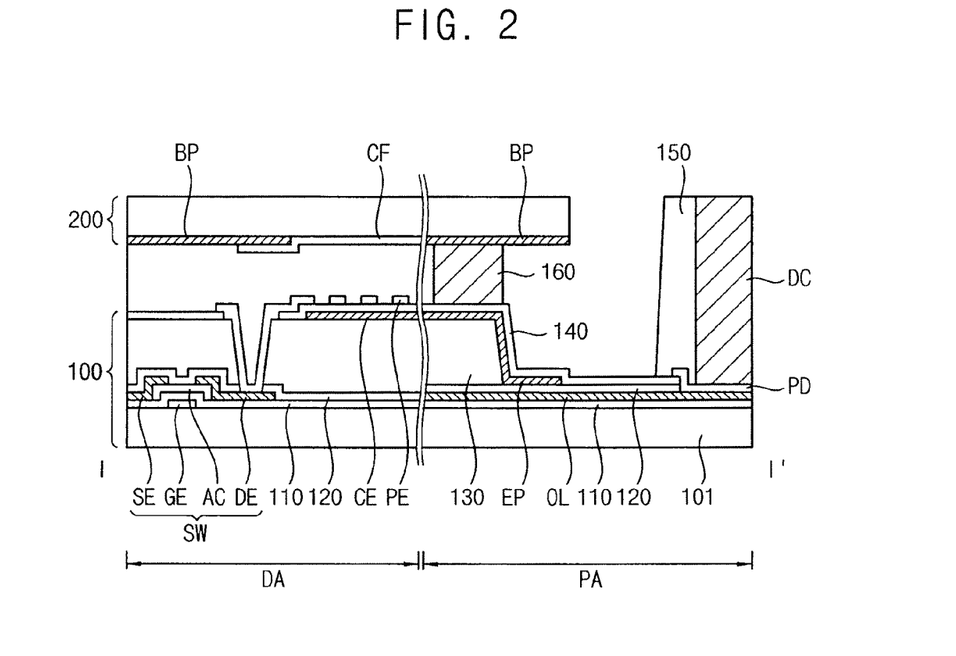
FIG. 2 is a cross-sectional view illustrating the display apparatus taken along line I-I' as shown in FIG. 1.

FIG. 1 is a plan view illustrating a display apparatus according to an exemplary embodiment. FIG. 2 is a cross-sectional view illustrating the display apparatus taken along line I-I' as shown in FIG. 1.

Referring to FIGS. 1 and 2, the display apparatus may include a display substrate 100 and an opposing substrate 200 opposite to the display substrate 100.

The display substrate 100 may include a display area DA and a peripheral area PA surrounding the display area DA.

A plurality of signal lines DL, GL and CL and a plurality of pixel parts PP connected to the signal lines DL, GL and CL are disposed in the display area DA. The signal lines DL, GL and CL may include a plurality of data lines DL, a plurality of gate lines GL and a plurality of common lines CL.

The data lines DL extend in a first direction D1 and are spaced apart in a second direction D2 crossing the first direction D1. The gate lines GL extend in the second direction D2 and are spaced apart in the first direction D1. The common lines CL may be parallel to the gate lines GL. Each of the pixel parts PP may include a switching element SW connected to a data line DL and a gate line GL, a common electrode CE connected to the common line CL and a pixel electrode PE connected to the switching element SW.

The switching element SW may include a gate electrode GE connected to the gate line GL, a source electrode SE connected to the data line DL, a drain electrode DE connected to the pixel electrode PE and an active pattern AC disposed in a spacing area between the drain electrode DE and the gate electrode GE.

The active pattern AC may include, for example, a semiconductor layer comprised of amorphous silicon (a-Si:H) and an ohmic contact layer comprised of an n+ amorphous silicon (n+ a-Si:H). In addition, the active pattern AC may include, for example, an oxide semiconductor. The oxide semiconductor may include, for example, an amorphous oxide including at least one selected from indium (In), zinc (Zn), gallium (Ga), tin (Sn) and hafnium (Hf). For example, the oxide semiconductor may comprise an amorphous oxide including indium (In), zinc (Zn) and gallium (Ga), or an amorphous oxide including indium (In), zinc (Zn) and hafnium (Hf). The oxide semiconductor may include, for example, an oxide such as indium zinc oxide (InZnO), indium gallium oxide (InGaO), indium tin oxide (InSnO), zinc tin oxide (ZnSnO), gallium tin oxide (GaSnO) and gallium zinc oxide (GaZnO). For example, the active pattern AC may include indium gallium zinc oxide (IGZO).

When the active pattern AC includes an oxide semiconductor, an etch stopper may be disposed on the active pattern AC.

The common electrode CE and the pixel electrode PE may include a transparent conductive material. For example, the transparent conductive material may include indium tin oxide (ITO), indium zinc oxide (IZO), etc.

In addition, the display substrate 100 may further include a base substrate 101, an insulating layer 110, a first protecting layer 120, an organic layer 130 and a second protecting layer 140. The insulating layer 110 is disposed between a first metal pattern that includes the gate electrode GE and the active pattern AC. The insulating layer 110 may include silicon oxide (SiOx) and silicon nitride (SiNx). When the active pattern AC includes an oxide semiconductor, the insulating layer 110 may have a double layer structure (SiOx/SiNx) that includes silicon oxide (SiOx) and silicon nitride (SiNx). In this case, the silicon oxide (SiOx) of the double layer structure may be disposed adjacent to the active pattern AC.

The first protecting layer 120 is disposed on a second metal pattern which may include the source electrode SE, the drain electrode DE, the data line DL and a plurality of fan-out lines OL. The first protecting layer 120 may include silicon oxide (SiOx) and silicon nitride (SiNx). When the active pattern AC includes an oxide semiconductor, the first protecting layer 120 have a double layer structure (SiOx/SiNx). In this case, the silicon oxide (SiOx) of the double layer structure may be disposed adjacent to the active pattern AC.

The organic layer 130 is disposed on the first protecting layer 120. The organic layer 130 may be thick enough to decrease parasitic capacitance between the data line and the common electrode CE. The organic layer 130 is disposed in the display area DA and a portion of the peripheral area PA. As shown in FIGS. 1 and 2, the organic layer 130 may extend into a portion of a fan-out part FOP.

The second protecting layer 140 is disposed between the common electrode CE and the pixel electrode PE. The second protecting layer 140 may include silicon oxide (SiOx) and silicon nitride (SiNx). The pixel part PP controls transmittance by manipulating an electric field between the pixel electrode PE and the common electrode CE to change a direction of the liquid crystal molecules.

A fan-out part FOP, a pad part PDP, a peripheral pattern PEP and an electrode pattern EP are disposed in the peripheral area PA. According to a present exemplary embodiment, the electrode pattern EP is connected to the peripheral pattern PEP.

The fan-out part FOP includes a plurality of fan-out lines OL respectively connected to the plurality of data lines DL. The fan-out lines OL may be part of the second metal pattern which includes the data line DL. The fan-out lines OL partially overlap with the organic layer 130 that extends from the display area DA.

The peripheral pattern PEP extends from the display area DA to a portion of the peripheral area PA. The peripheral pattern PEP may be electrically connected to the common electrode CE and receive a common voltage provided to the common electrode CE. Alternatively, the peripheral pattern PEP may be electrically floated.

The electrode pattern EP is connected to the peripheral pattern PEP and extends to a boundary portion of the organic layer 130 in the peripheral area PA. The electrode pattern EP covers the boundary portion of the organic layer 130 to prevent water from permeating into the boundary portion of the organic layer 130. Therefore, a signal line, such as a fan-out line OL in the peripheral area PA, may be protected from water permeation damage.

The pad part PDP includes a plurality of pads PD connected to end portions of the fan-out lines OL. The pads PD are electrically connected to a terminal of a driving chip DC via an adhesion member 150. The adhesion member 150 may include silicon.

The opposing substrate 200 is opposite to the display substrate 100 and is combined with the display substrate 100 by a sealant 160.

The opposing substrate 200 may include a display area DA and a peripheral area PA respectively corresponding to those of the display substrate 100. A color filter CF and a blocking pattern BP are disposed in the display area DA of the opposing substrate 200. The color filter CF may be disposed in an area in which the pixel electrode PE is disposed. The blocking pattern BP may be disposed in areas in which metal patterns, such as the data line DL, the gate line GL, the switching element SW, etc., are disposed. In addition, the blocking pattern BP is disposed in the peripheral area PA of the opposing substrate 200.

FIGS. 3A to 3D are cross-sectional views illustrating one manufacturing method of a display substrate as shown in FIG. 2.

Figure 3A:
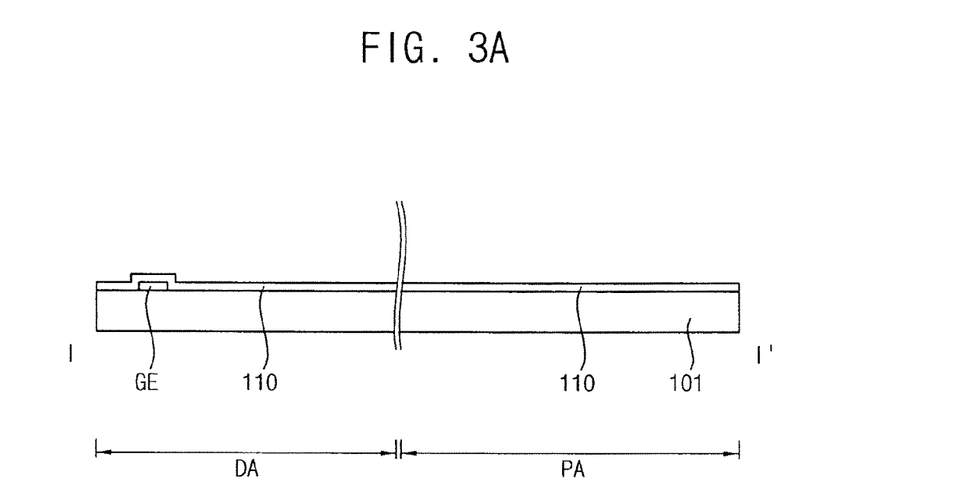
FIGS. 3A to 3D are cross-sectional views illustrating one method of manufacturing a display substrate as shown in FIG. 2.

Referring to FIGS. 1, 2 and 3A, a first metal layer is formed on the base substrate 101. For example, the first metal layer may include a metal such as chromium (Cr), aluminum (Al), tantalum (Ta), molybdenum (Mo), titanium (Ti), tungsten (W), copper (Cu), silver (Ag), etc., or an alloy thereof. The first metal layer may include two or more layers each having different physical characteristics.

The first metal layer is patterned to form a first metal pattern. The first metal pattern may include the gate electrode GE, the gate line GL and the common line CL.

The insulating layer 110 is formed on the base substrate 101 on which the first metal pattern is formed. The insulating layer 110 may include silicon oxide (SiOx) and silicon nitride (SiNx).

Figure 3B:
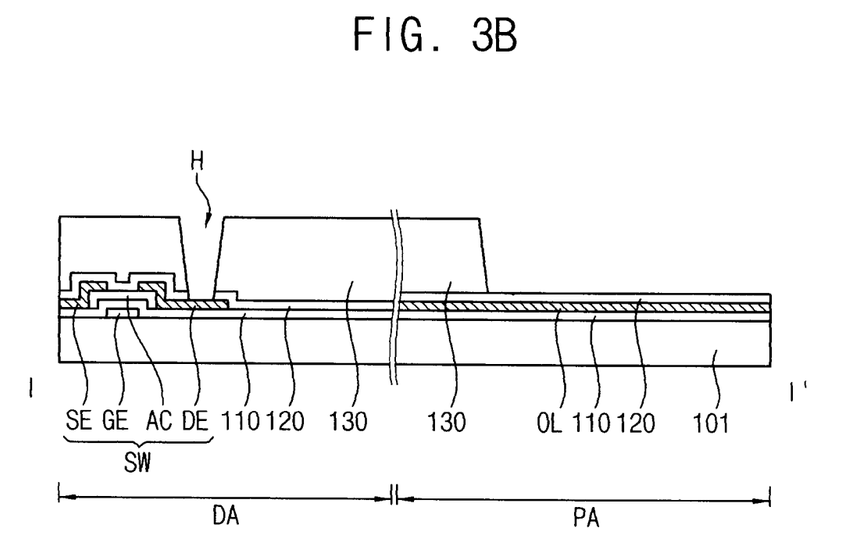

Referring to FIGS. 1, 2 and 3B, an active layer is formed on the base substrate 101 on which the insulating layer 110 is formed. The active layer is patterned to form the active pattern AC disposed on the gate electrode. The active pattern AC may include amorphous silicon (a-Si:H) or an oxide semiconductor.

A second metal layer is formed on the base substrate 101 on which the active pattern AC is formed. The second metal layer includes a metal such as chromium (Cr), aluminum (Al), tantalum (Ta), molybdenum (Mo), titanium (Ti), tungsten (W), copper (Cu), silver (Ag), etc., or an alloy thereof. The second metal layer may include two or more layers each having different physical characteristics.

The second metal layer is patterned to form a second metal pattern. The second metal pattern includes the source electrode SE, the drain electrode DE, the data line DL and the fan-out line OL.

A first protecting layer 120 is formed to cover the second metal pattern on the base substrate 101. The first protecting layer 120 covers the switching element SW of the display area DA and the fan-out line OL of the peripheral area PA. The first protecting layer 120 may include silicon oxide (SiOx) and silicon nitride (SiNx).

The organic layer 130 is formed on the base substrate 101 on which the first protecting layer 120 is formed. The organic layer 130 is formed sufficiently thick to decrease a parasitic capacitance between the second metal pattern and the common electrode CE.

The organic layer 130 is patterned to form a hole H that exposes the drain electrode DE in the display area DA. In addition, the organic layer 130 is patterned to expose a portion of the fan-out part FOP and the pad part PDP in the peripheral area PA.

Figure 3C:
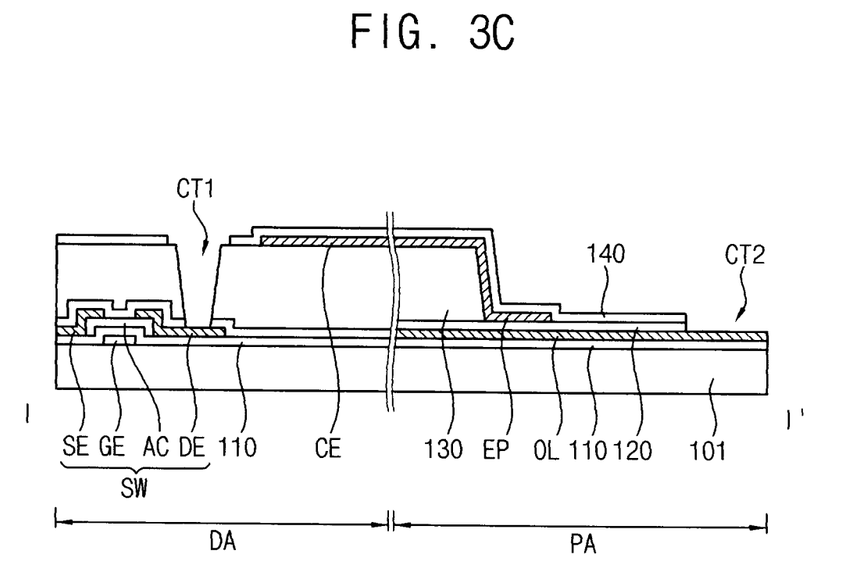

Referring to FIGS. 1, 2 and 3C, a first transparent conductive layer is formed on the base substrate 101 on which the hole H is formed. The first transparent conductive layer is patterned to form the common electrode CE in the display area DA and the peripheral pattern PEP and the electrode pattern EP connected to the peripheral pattern PEP in the peripheral area.

The peripheral pattern PEP may extend from the display area DA to a portion of the peripheral area PA. The peripheral pattern PEP may be electrically connected to the common electrode CE and may receive the common voltage provided to the common electrode CE. Alternatively, the peripheral pattern PEP may be spaced apart and electrically disconnected from the common electrode CE of the display area DA.

The electrode pattern EP extends from the peripheral pattern PEP to a boundary portion of the organic layer 130 is disposed, to cover the boundary portion of the organic layer 130. The electrode pattern EP covers the boundary portion of the organic layer 130, which is vulnerable to water permeation, to prevent water permeation damage to the fan-out lines OL.

A second protecting layer 140 is formed on the base substrate 101 on which the common electrode CE and the peripheral pattern PEP are formed. The second protecting layer 140 may include silicon oxide (SiOx) and silicon nitride (SiNx).

The first and second protecting layers 120 and 140 are patterned to form a first contact hole CT1 that corresponds to the hole H and a second contact hole CT2 that exposes an end portion of the fan-out lines OL.

Figure 3D:
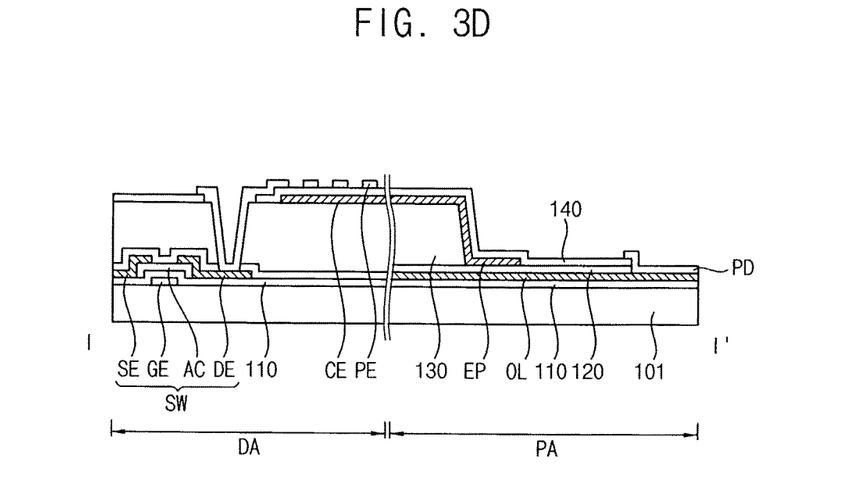

Referring to FIGS. 1, 2 and 3D, a second transparent conductive layer is formed on the base substrate 101 on which the first and second contact holes CT1 and CT2 are formed. The second transparent conductive layer is patterned to form the pixel electrode PE in the display area DA and the pad PD in the peripheral area PA. The first and second transparent conductive layers may include indium tin oxide (ITO), indium zinc oxide (IZO), etc.

According to a present exemplary embodiment, a mask design for patterning the first transparent conductive layer changes to form the electrode pattern EP that covers the boundary portion of the organic layer 130. Therefore, the electrode pattern EP may be formed without additional processes, which can prevent water permeation damage to the signal lines, such as the fan-out lines OL disposed in the boundary portion of the organic layer.

Figure 4:
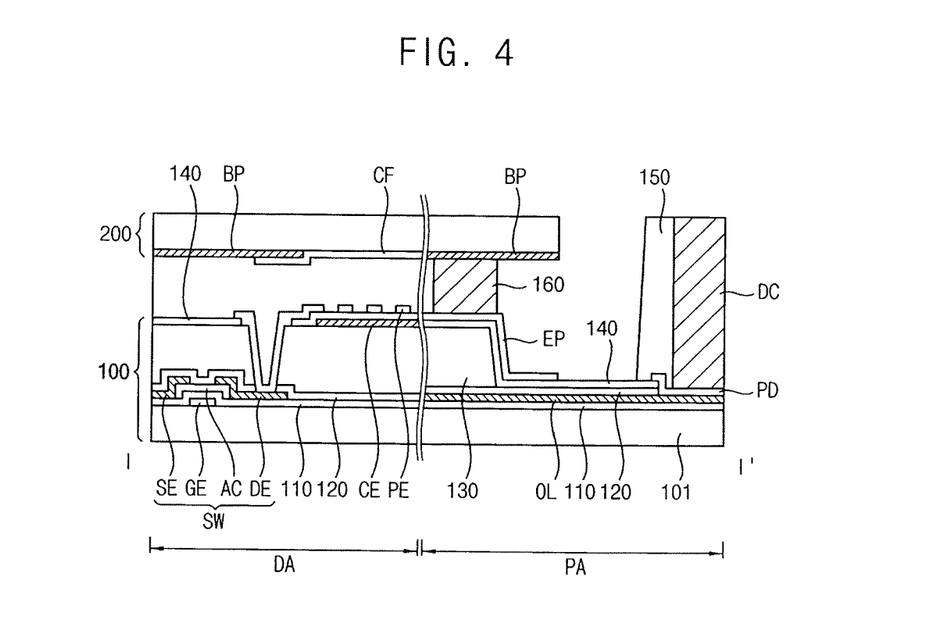
FIG. 4 is a cross-sectional view illustrating a display apparatus according to another exemplary embodiment.

FIG. 4 is a cross-sectional view illustrating a display apparatus according to another exemplary embodiment. Hereinafter, the same reference numerals are used to refer to the same or similar parts as those described in previous exemplary embodiments, and the same detailed explanations are simplified.

Referring to FIGS. 1 and 4, according to a present exemplary embodiment, a display apparatus includes a peripheral pattern PEP and an electrode pattern EP that extends from the peripheral pattern PEP. The peripheral pattern PEP and the electrode pattern EP according to a present exemplary embodiment are formed from the same second transparent conductive layer as the pixel electrode PE. The peripheral pattern PEP and the electrode pattern EP are disposed on the second protecting layer 140.

The peripheral pattern PEP covers a portion of the fan-out part FOP. The electrode pattern EP extends from the peripheral pattern PEP to the boundary portion of the organic layer 130 to cover the boundary portion of the organic layer 130. The boundary portion of the organic layer 130 may be protected from water permeation damage by the electrode pattern EP, thus the fan-out lines OL disposed in the boundary portion of the organic layer 130 may be protected from water permeation damage.

As compared with a previous exemplary embodiment described with reference to FIGS. 3A to 3D, a method of manufacturing the display substrate 100 according to a present exemplary embodiment is substantially the same as that of manufacturing a display substrate of a previous exemplary embodiment, except for, processes of pattering the first and second transparent conductive layers.

Referring to FIGS. 3C and 4, the first transparent conductive layer is patterned to form the common electrode CE in the display area DA.

Referring to FIGS. 3D and 4, the second transparent conductive layer is patterned to form the pixel electrode PE in the display area DA and the peripheral pattern PEP, the electrode pattern EP and the pad PD in the peripheral area PA.

The peripheral pattern PEP covers a portion of the fan-out part FOP. The electrode pattern EP is connected to the peripheral pattern PEP and covers the boundary portion of the organic layer 130.

As described above, according to a present exemplary embodiment, a mask design for patterning the second transparent conductive layer changes to form the electrode pattern EP that covers the boundary portion of the organic layer 130. Therefore, the electrode pattern EP may be formed without additional processes, which can prevent water permeation damage to signal lines disposed in the boundary portion of the organic layer.

Figure 5:
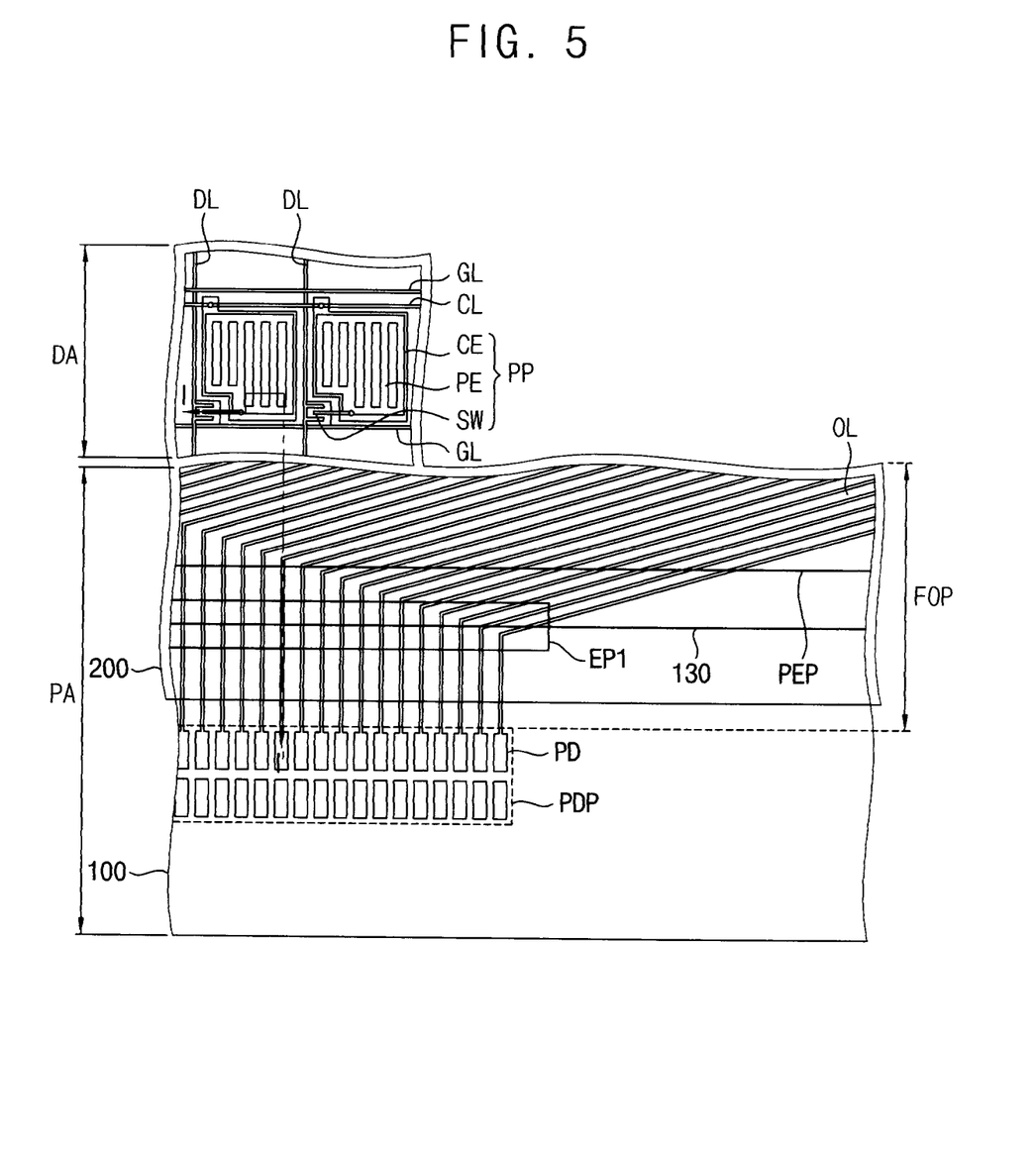
FIG. 5 is a cross-sectional view illustrating a display apparatus according to still another exemplary embodiment.
Figure 6:
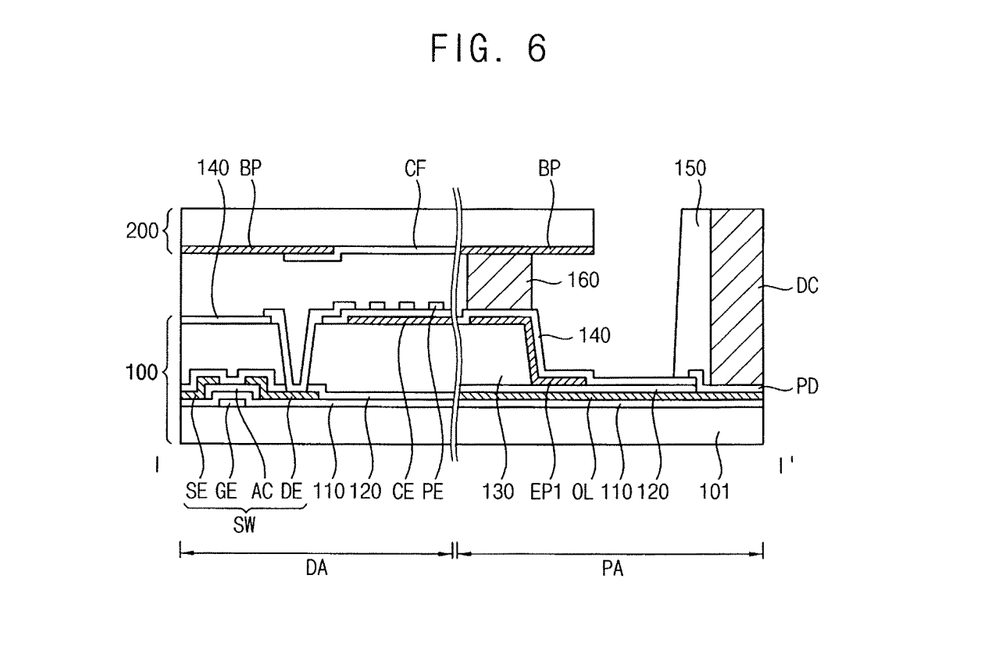
FIG. 6 is a cross-sectional view illustrating the display apparatus taken along line I-I' as shown in FIG. 5.

FIG. 5 is a cross-sectional view illustrating a display apparatus according to another exemplary embodiment. FIG. 6 is a cross-sectional view illustrating the display apparatus taken along line I-I' as shown in FIG. 5. Hereinafter, the same reference numerals are used to refer to the same or similar parts as those described in the previous exemplary embodiments, and the same detailed explanations are simplified.

Referring to FIGS. 5 and 6, according to a present exemplary embodiment, a display apparatus includes an electrode pattern EP1 that covers the boundary portion of the organic layer 130 that extends from the display area to a portion of the peripheral area PA. The electrode pattern EP1 according to a present exemplary embodiment extends in a direction that crosses the plurality of fan-out lines OL and has an island shape. Therefore, the electrode pattern EP 1 covers the fan-out lines OL in the boundary portion of the organic layer 130.

For example, according to a present exemplary embodiment, the display substrate 100 includes a display area DA and a peripheral area PA surrounding the display area DA.

The data line DL, the gate line GL, the common line CL, the pixel electrode PE and the common electrode CE are disposed in the display area DA. The fan-out part FOP, the pad part PDP, the peripheral pattern PEP and the electrode pattern EP1 are disposed in the peripheral area PA.

The organic layer 130 is disposed in the display area DA and is sufficiently thick to decrease the parasitic capacitance between the data line DL and the common electrode CE. The organic layer 130 is disposed in the display area DA and a portion of the peripheral area PA that extends from the display area DA.

The peripheral pattern PEP extends from the display area DA to a portion of the fan-out part FOP in the peripheral area PA. The peripheral pattern PEP may be electrically connected to the common electrode CE. Alternatively, the peripheral pattern PEP may be disposed as an island to be electrically disconnected to the common electrode CE.

The electrode pattern EP1 has an island shape and covers the boundary portion of the organic layer 130 that extends into the peripheral area PA. The electrode pattern EP1 prevents water from permeating into the boundary portion of the organic layer 130 to prevent water permeation damage to signal lines, such as the fan-out lines OL, disposed in the boundary portion of the organic layer 130.

According to a present exemplary embodiment, the electrode pattern EP1 is formed from the same transparent conductive layer as the common electrode CE in the display area DA and the peripheral pattern PEP in the peripheral area PA.

As compared with a previous exemplary embodiment described with reference to FIGS. 3A to 3D, a method of manufacturing the display substrate 100 according to a present exemplary embodiment is substantially the same as that of manufacturing a display substrate of the previous exemplary embodiment, except for processes of pattering the first transparent conductive layer.

For example, referring to FIGS. 3C, 5 and 6, the first transparent conductive layer is formed on the organic layer 130. The first transparent conductive layer is patterned to form the common electrode CE in the display area DA and the peripheral pattern PEP and the electrode pattern EP1 in the peripheral area PA.

According to a present exemplary embodiment, a mask design for patterning the first transparent conductive layer changes to form the electrode pattern EP 1 covering the boundary portion of the organic layer 130. Therefore, the electrode pattern EP1 may be formed without additional processes, which can prevent water permeation damage to the signal line disposed in the boundary portion of the organic layer.

Figure 7:
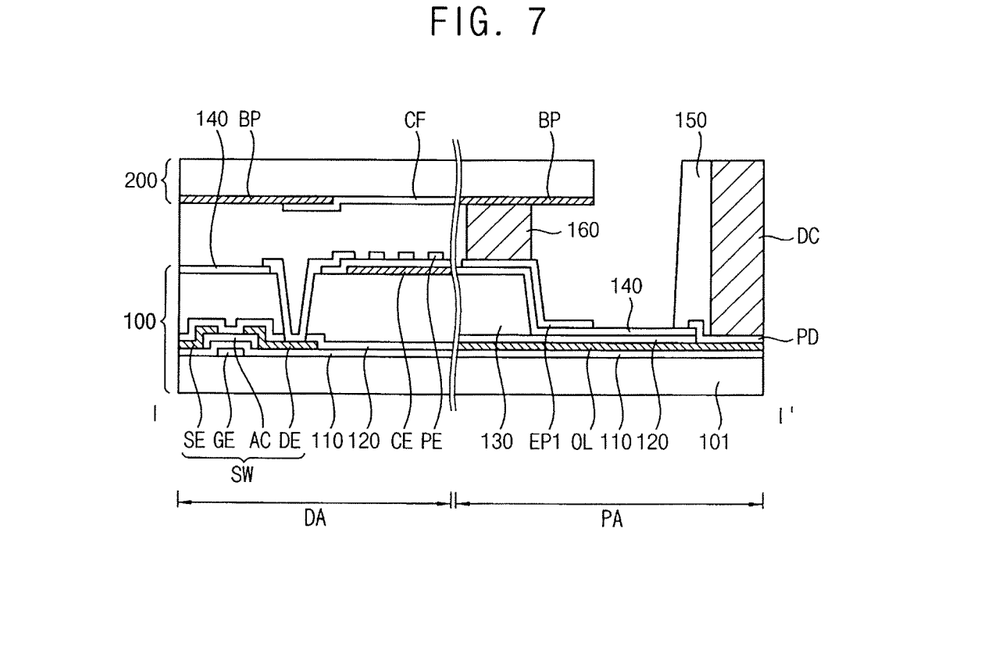
FIG. 7 is a cross-sectional view illustrating a display apparatus according to still another exemplary embodiment.

FIG. 7 is a cross-sectional view illustrating a display apparatus according to still another exemplary embodiment. Hereinafter, the same reference numerals are used to refer to the same or similar parts as those described in the previous exemplary embodiments, and the same detailed explanations are simplified.

Referring to FIGS. 5 and 7, according to a present exemplary embodiment, the display apparatus includes an island shaped electrode pattern EP1 covering the boundary portion of the organic layer 130 in the peripheral area PA. The electrode pattern EP1 according to a present exemplary embodiment is formed from the same second transparent conductive layer as the pixel electrode PE in the display area DA and the pad PD in the peripheral area PA.

As compared with a previous exemplary embodiment described with reference to FIGS. 3A to 3D, a method of manufacturing the display substrate 100 according to a present exemplary embodiment includes forming the organic layer 130 on the base substrate 101 as shown in FIG. 3C.

Then, the first transparent conductive layer is formed on the base substrate 101 on which the organic layer 130 is formed. The first transparent conductive layer is patterned as shown in FIG. 5 to form the common electrode CE in the display area DA and the peripheral pattern PEP that covers a portion of the fan-out part FOP in the peripheral area PA.

As shown in FIG. 3D, the second protecting layer 140 is formed on the base substrate 101 on which the common electrode CE and the peripheral pattern PEP are formed. The second transparent conductive layer is formed on the second protecting layer 140.

The second transparent conductive layer is patterned to form the pixel electrode PE that overlaps the common electrode CE in the display area DA and to form the pad PD in the peripheral area PA. In addition, according to a present exemplary embodiment, an island shaped electrode pattern EP1 is formed from the second transparent conductive layer to cover the boundary portion of the organic layer 130 in the peripheral area PA.

As described above, according to a present exemplary embodiment, a mask design of a mask for patterning the second transparent conductive layer changes to form the electrode pattern EP1 covering the boundary portion of the organic layer 130. Therefore, the electrode pattern EP 1 may be formed without additional processes, which can prevent water permeation damage to the signal lines in the boundary portion of the organic layer.

Figure 8:
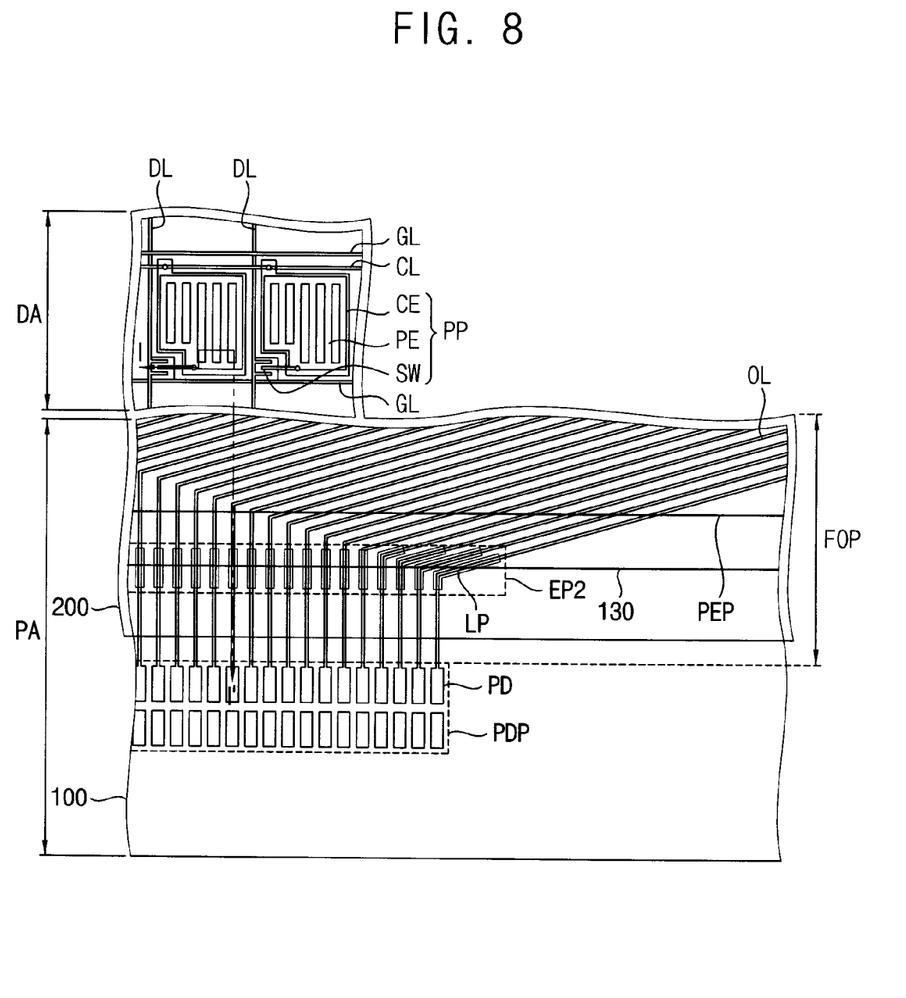
FIG. 8 is a cross-sectional view illustrating a display apparatus according to still another exemplary embodiment.

FIG. 8 is a cross-sectional view illustrating a display apparatus according to still another exemplary embodiment. Hereinafter, the same reference numerals are used to refer to the same or similar parts as those described in previous exemplary embodiments, and the same detailed explanations are simplified.

Referring to FIG. 8, according to a present exemplary embodiment, the display apparatus includes an electrode pattern EP2 that covers the boundary portion of the organic layer 130 in the peripheral area PA. The electrode pattern EP2 according to a present exemplary embodiment includes a plurality of line electrode patterns LP that respectively overlap the plurality of fan-out lines OL. Each of the line electrode patterns LP has a width greater than that of the fan-out line OL.

For example, according to a present exemplary embodiment, the display substrate 100 includes a display area DA and a peripheral area PA surrounding the display area DA.

The data line DL, the gate line GL, the common line CL, the pixel electrode PE and the common electrode CE are disposed in the display area DA. The fan-out part FOP, the pad part PDP, the peripheral pattern PEP and the electrode pattern EP2 are disposed in the peripheral area PA.

The organic layer 130 is disposed in the display area DA and is sufficiently thick to decrease the parasitic capacitance between the data line DL and the common electrode CE. The organic layer 130 is disposed in the display area DA and a portion of the peripheral area PA that extends from the display area DA.

The peripheral pattern PEP extends from the display area DA to a portion of the fan-out part FOP in the peripheral area PA. The peripheral pattern PEP may be electrically connected to the common electrode CE. Alternatively, the peripheral pattern PEP may be disposed as an island to be electrically disconnected to the common electrode CE.

The electrode pattern EP2 includes a plurality of line electrode patterns LP. Each of the line electrode patterns LP respectively overlaps each of the fan-out lines OL. Each of the line electrode patterns LP has a width greater than that of the fan-out line OL.

According to a present exemplary embodiment, the electrode pattern EP2 can prevent water from permeating into the boundary portion of the organic layer 130, which can prevent water permeation damage to the signal lines, such as the fan-out lines OL disposed in the boundary portion of the organic layer 130

The electrode pattern EP2 may be formed from the first transparent conductive layer, from which the common electrode CE in the display area DA and the peripheral pattern PEP in the peripheral area PA are formed, as shown in FIG. 6.

Alternatively, the electrode pattern EP2 may be formed from the second transparent conductive layer, from which the pixel electrode PE in the display area DA and the pad PD in the peripheral area PA are formed, as shown in FIG. 7.

Therefore, according to a present exemplary embodiment, a mask design for patterning the first or second transparent conductive layer changes to form the electrode pattern EP2 covering the boundary portion of the organic layer 130. The electrode pattern EP2 includes the plurality of line electrode patterns LP that respectively overlap the plurality of fan-out lines OL. Therefore, the electrode pattern EP 2 may be formed without additional processes, which can prevent water permeation damage to the signal lines disposed in the boundary portion of the organic layer.

Figure 9:
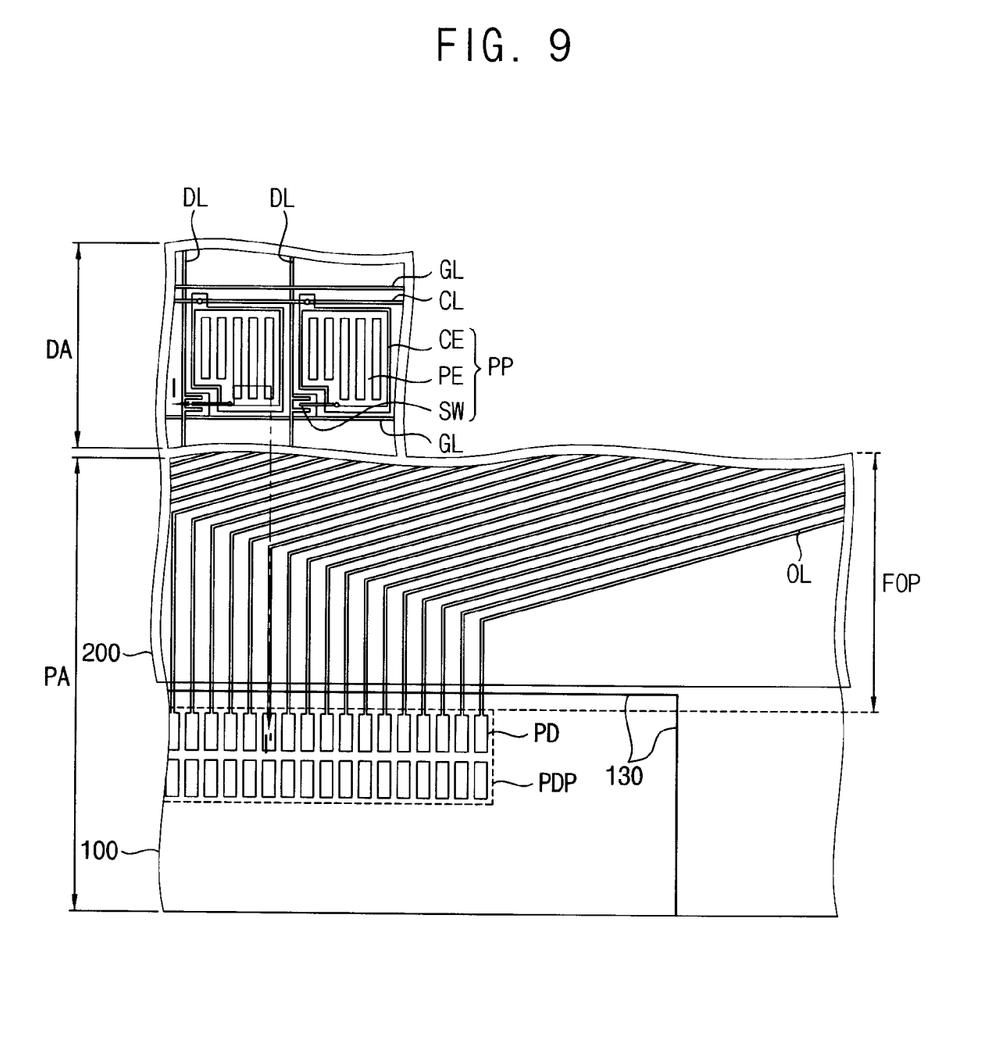
FIG. 9 is a cross-sectional view illustrating a display apparatus according to still another exemplary embodiment.
Figure 10:
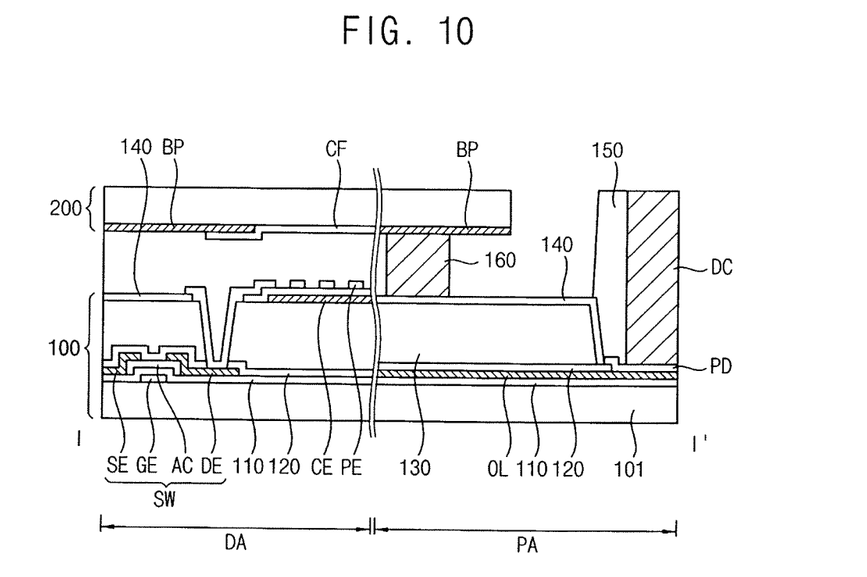
FIG. 10 is a cross-sectional view illustrating a display apparatus taken along line I-I' as shown in FIG. 9.

FIG. 9 is a cross-sectional view illustrating a display apparatus according to still another exemplary embodiment. FIG. 10 is a cross-sectional view illustrating the display apparatus taken along line I-I' as shown in FIG. 9. Hereinafter, the same reference numerals are used to refer to the same or similar parts as those described in the previous exemplary embodiments, and the same detailed explanations are simplified.

Referring to FIGS. 9 and 10, a display apparatus includes an organic layer 130 disposed in those areas of the display substrate 100 except for an area in which the pad part PDP is disposed. The pad part PDP includes a chip area in which a driving chip is disposed and an adhesion area in which an adhesion member 150 electrically connecting the driving chip with the pad PD is disposed.

According to a present exemplary embodiment, the organic layer 130 is disposed in the display area DA and the peripheral area PA, except for an area in which the pad part PDP is disposed. The organic layer 130 generally covers an area in which the fan-out lines OL of the fan-out part FOP are disposed. The adhesion member 150 covers an area in which the fan-out lines OL adjacent to the pads PD are disposed. The adhesion member 150 electrically connects a terminal of the driving chip DC with the pads PD and overlaps a boundary portion of the organic layer 130.

The organic layer 130 and the adhesion member 150 can prevent water from permeating into the peripheral area PA.

Therefore, signal lines, such as the fan-out lines OL disposed in the peripheral area PA, may be protected from water permeation damage.

As compared with the previous exemplary embodiment described with reference to FIGS. 3A to 3D, a method of manufacturing the display substrate 100 according to a present exemplary embodiment is substantially the same as that of manufacturing the display substrate of a previous exemplary embodiment, except for processes of pattering the organic layer 130.

For example, referring to FIGS. 3B and 10, the organic layer 130 is formed on the base substrate 101 on which the first protecting layer 120 is formed.

The organic layer 130 is patterned to from the hole H that exposes the drain electrode DE and to expose the pad part PDP in the peripheral area PA. According to a present exemplary embodiment, the organic layer 130 is generally disposed on the fan-out part FOP in the peripheral area PA. Therefore, the organic layer 130 may protect the fan-out lines OL from water permeation.

Then, the adhesion member 150 is formed on the pad part PDP. The adhesion member 150 covers the boundary portion of the organic layer 130 adjacent to the pad part PDP. Thus, the organic layer 130 and the adhesion member 150 can prevent water permeation damage to the signal lines disposed in the peripheral area PA, such as the fan-out lines OL.

According to a presented exemplary embodiment, the organic layer 130 extends from the display area DA to the adhesion area in which the adhesion member 150 is disposed, to block the fan-out lines OL in the peripheral area from water. Therefore, the signal line disposed in the peripheral area PA may be protected from water permeation damage without additional processes.

According to exemplary embodiments of the present disclosure, an electrode pattern covers the boundary portion of the organic layer to prevent water permeation damage to the fan-out lines in the boundary portion of the organic layer. In addition, the organic layer extends to an area adjacent to the pad part, and the adhesion member disposed on the pad part overlaps the boundary portion of the organic layer, to prevent water permeation damage to the fan-out lines disposed in the peripheral area.

The foregoing is illustrative of embodiments of the present disclosure and is not to be construed as limiting thereof. Although a few exemplary embodiments of the present disclosure have been described, those skilled in the art will readily appreciate that many modifications are possible in the exemplary embodiments without materially departing from the novel teachings of embodiments of the present disclosure. Accordingly, all such modifications are intended to be included within the scope of the present disclosure as defined in the claims. Therefore, it is to be understood that modifications to the disclosed exemplary embodiments, as well as other exemplary embodiments, are intended to be included within the scope of the appended claims. The present disclosure is defined by the following claims, with equivalents of the claims to be included therein.

What is claimed is:

1. A display apparatus comprising:
    a pixel part disposed in a display area of a base substrate that comprises a switching element connected to a signal line, a pixel electrode connected to the switching element and a common electrode that overlaps the pixel electrode;
    a plurality of fan-out lines disposed in a peripheral area of the base substrate that are connected to the signal line of the display area;
    a plurality of pads disposed in the peripheral area of the base substrate that are respectively connected to end portions of the fan-out lines;
    a first protective layer disposed on the switching element, the signal line and the plurality of fan-out lines;
    an organic layer disposed on the first protective layer that covers the switching element of the display area and that extends from the display area to a portion of the fan-out lines; and
    an electrode pattern that overlaps the fan-out lines in a boundary portion of the organic layer,
    wherein the common electrode is disposed between the pixel electrode and the organic layer,
    wherein the electrode pattern and the common electrode are disposed in the same layer, and
    the first protective layer separates the electrode pattern from the plurality of fan-out lines,
    wherein the electrode pattern does not make contact with the pads.

2. The display apparatus of claim 1, further comprising:
    a peripheral pattern that covers a portion of the fan-out lines.

3. The display apparatus of claim 2, wherein the electrode pattern extends from the peripheral pattern.

4. The display apparatus of claim 2, wherein the electrode pattern has an island shape that is spaced apart from the peripheral pattern and extends in a direction that crosses the fan-out lines.

5. The display apparatus of claim 4, wherein the electrode pattern comprises a plurality of line electrode patterns, each of which overlaps one of the plurality of fan-out lines.

6. The display apparatus of claim 1, further comprising:
a second protecting layer disposed on the organic layer, wherein the electrode pattern is disposed between the second protecting layer and the organic layer.

7. The display apparatus of claim 1, wherein the electrode pattern is electrically connected with the common electrode.

8. The display apparatus of claim 1, wherein the pixel electrode and the common electrode are disposed on the organic layer.

* * * * *